United States Patent
Fan et al.

(10) Patent No.: US 12,107,036 B2
(45) Date of Patent: Oct. 1, 2024

(54) REDISTRIBUTION LAYER STRUCTURE AND MANUFACTURING METHOD THEREOF

(71) Applicant: Innolux Corporation, Miao-Li County (TW)

(72) Inventors: Kuo-Jung Fan, Miao-Li County (TW); Cheng-Chi Wang, Miao-Li County (TW); Heng-Shen Yeh, Miao-Li County (TW); Chuan-Ming Yeh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 402 days.

(21) Appl. No.: 17/533,068

(22) Filed: Nov. 22, 2021

(65) Prior Publication Data

US 2022/0181242 A1  Jun. 9, 2022

(30) Foreign Application Priority Data

Dec. 7, 2020 (CN) .......................... 202011418487.7
Nov. 10, 2021 (CN) .......................... 202111324446.6

(51) Int. Cl.
*H01L 23/498* (2006.01)
*H01L 21/48* (2006.01)

(52) U.S. Cl.
CPC .... *H01L 23/49822* (2013.01); *H01L 21/4857* (2013.01); *H01L 23/49838* (2013.01); *H01L 23/49866* (2013.01)

(58) Field of Classification Search
CPC ......... H01L 23/5329–53295; H01L 24/18–20; H01L 24/82; H01L 23/145; H01L 23/5383; H01L 21/76822–76828
See application file for complete search history.

(56) References Cited

U.S. PATENT DOCUMENTS

| | | | |
|---|---|---|---|
| 2004/0226827 A1* | 11/2004 | Matsuda | H01L 21/2885 205/123 |
| 2013/0009293 A1* | 1/2013 | Tseng | H01L 24/19 257/E23.033 |
| 2013/0200528 A1 | 8/2013 | Lin et al. | |
| 2016/0013148 A1* | 1/2016 | Lin | H01L 24/19 257/773 |
| 2017/0164458 A1* | 6/2017 | Vrtis | H05K 1/0298 |
| 2018/0082962 A1 | 3/2018 | Lee et al. | |
| 2019/0131262 A1* | 5/2019 | Yu | H01L 21/563 |

* cited by examiner

*Primary Examiner* — Evan G Clinton
(74) *Attorney, Agent, or Firm* — JCIPRNET

(57) ABSTRACT

A redistribution layer structure and the manufacturing method thereof are provided. The redistribution layer structure includes a first metal layer, a first dielectric layer, a second metal layer, and a second dielectric layer. The first dielectric layer is disposed on the first metal layer. The second metal layer is disposed on the first dielectric layer. The second dielectric layer is disposed on the second metal layer. A chemical resistance of the first dielectric layer is greater than a chemical resistance of the second dielectric layer.

16 Claims, 3 Drawing Sheets

REDISTRIBUTION LAYER STRUCTURE AND MANUFACTURING METHOD THEREOF

CROSS-REFERENCE TO RELATED APPLICATION

This application claims the priority benefit of China application serial no. 202011418487.7, filed on Dec. 17, 2020, and China application serial no. 202111324446.6, filed on Nov. 10, 2021. The entirety of each of the above-mentioned patent applications is hereby incorporated by reference herein and made a part of this specification.

BACKGROUND

Technical Field

The disclosure relates to a circuit structure of an electronic device, and in particular to a redistribution layer structure of an electronic device and a manufacturing method thereof.

Description of Related Art

As the applications of electronic devices continue to diversify, the development of display technology is also constantly updated. Under different manufacturing process conditions, the requirements for the structure and quality of the electronic device are increasing and the electronic device are faced with different challenges. Therefore, the research and development of electronic devices need to be continuously updated and adjusted.

SUMMARY

The disclosure provides a redistribution layer structure, which has good structural strength or quality.

The disclosure provides a manufacturing method of the redistribution layer structure, which has good process yield or quality.

According to an embodiment of the disclosure, the redistribution layer structure includes a first metal layer, a first dielectric layer, a second metal layer, and a second dielectric layer. The first dielectric layer is disposed on the first metal layer. The second metal layer is disposed on the first dielectric layer. The second dielectric layer is disposed on the second metal layer. A chemical resistance of the first dielectric layer is greater than a chemical resistance of the second dielectric layer.

According to an embodiment of the disclosure, the manufacturing method of the redistribution layer structure includes the following steps. Providing a first metal layer. Disposing the first dielectric layer on the first metal layer. Disposing the second metal layer on the first dielectric layer. Disposing the second dielectric layer on the second metal layer. A chemical resistance of the first dielectric layer is greater than a chemical resistance of the second dielectric layer.

Based on the above, in the redistribution layer structure of the embodiment of the disclosure, the chemical resistance of the first dielectric layer is greater than that of the second dielectric layer. Therefore, the first dielectric layer, which has gone through more process steps than the second dielectric layer, can reduce the influence of the process on its structure or maintain its structural rigidity due to its larger chemical resistance. The second dielectric layer can reduce the influence of its deformation or the probability of warpage during the manufacturing process. In this way, in the manufacturing process, the redistribution layer structure can achieve good process yield or quality. In addition, the formed redistribution layer structure has good structural rigidity or quality.

To make the aforementioned more comprehensible, several embodiments accompanied with drawings are described in detail as follows.

DESCRIPTION OF THE EMBODIMENTS

Figure 1:
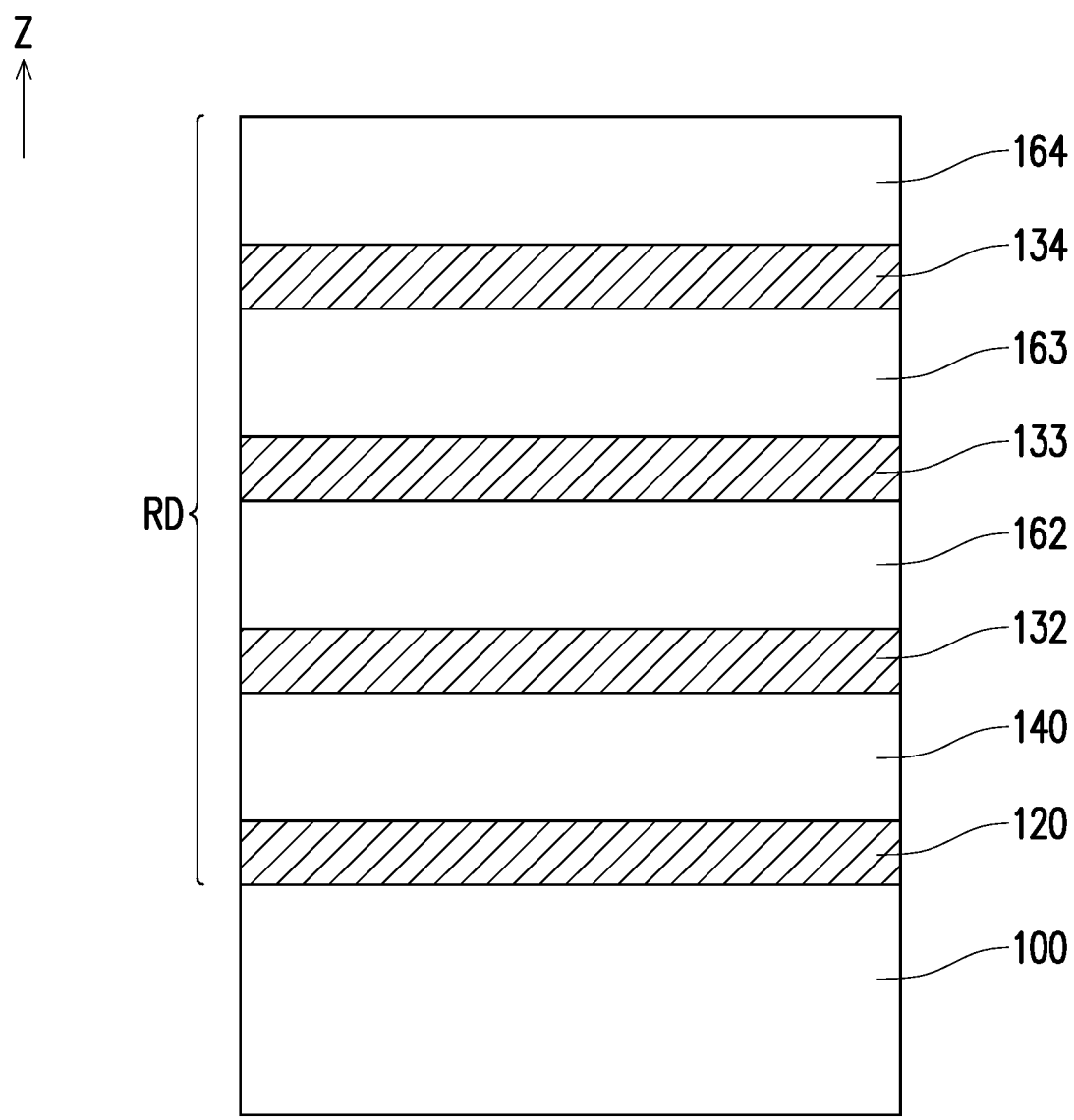
FIG. 1 is a schematic cross-sectional view of a redistribution layer structure according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

Throughout the specification and the appended claims of the disclosure, certain terms are used to refer to specific components. Those skilled in the art should understand that electronic device manufacturers may probably use different names to refer to the same components. This specification is not intended to distinguish between components that have the same function but different names. In the following specification and claims, the terms "including", "containing", "having" etc., are open-ended terms, so they should be interpreted to mean "including but not limited to . . . ". Therefore, when the terms "including", "containing" and/or "having" are used in the description of the disclosure, they specify existence of corresponding features, regions, steps, operations and/or components, but do not exclude existence of one or more corresponding features, regions, steps, operations and/or components.

Directional terminology mentioned herein, such as "top", "bottom", "front", "back", "left", "right", etc., is used with reference to the orientation of the drawings. Therefore, the used directional terminology is only intended to illustrate, rather than limit, the disclosure. The drawings illustrate general characteristics of methods, structures, and/or materials used in specific embodiments. However, these drawings should not be construed as defining or limiting the scope or nature covered by these embodiments. For example, for clarity, relative sizes, thickness, and location of film layers, regions, and/or structures may be reduced or enlarged.

It should be understood that when a component or a film layer is referred to as being "connected to" another component or film layer, it can be directly connected to the another component or film layer, or there may be an intervening component or film layer between the two. When a component is said to be "directly connected to" another component or film, there is no intervening component or film between the two. In addition, when a component is referred to as being "coupled to another component (or a variation thereof)", it can be directly connected or electrically connected to the another component, or indirectly connected or electrically connected to the another component through one or more components.

In the disclosure, the length and width may be measured by an optical microscope, and the thickness may be measured based on a cross-sectional image in an electron microscope, but the disclosure is not limited thereto. In addition, there may be a certain error between any two values or directions used for comparison.

The terms such as "about", "equal", "same", "identical", "substantially", or "approximately" are generally interpreted as one value being within a range of plus or minus 20% of a given value, or as being within a range of plus or minus 10%, plus or minus 5%, plus or minus 3%, plus or minus 2%, plus or minus 1%, or plus or minus 0.5% of the given value.

In the disclosure, when a structure (or layer, component, substrate etc.) is described as being located on/above another structure (or layer, component, substrate, etc.), it may mean that the two structures are adjacent and directly connected, or it may mean that the two structures are adjacent but are not directly connected. "Not being directly connected" means that at least one intermediate structure (or intermediate layer, intermediate component, intermediate substrate, intermediate gap, etc.) is present between the two structures, where the lower surface of one structure is adjacent or directly connected to the upper surface of the intermediate structure, the upper surface of the other structure is adjacent or directly connected to the lower surface of the intermediate structure, and the intermediate structure may be composed of a single-layer or multi-layer physical structure or non-physical structure and is not specifically limited herein. In the disclosure, when one structure is disposed "on" another structure, it may mean that the one structure is "directly" on the another structure, or it may mean that the one structure is "indirectly" on the another structure (i.e., at least one other structure is interposed between the one structure and the another structure).

The terms such as "first", "second", etc. used in the specification of the disclosure may be used to describe devices, components, regions, layers, and/or parts, but the devices, components, regions, layers, and/or parts should not be limited by these terms. The terms are only intended to distinguish between a device, component, region, layer, or part from another device, component, region, layer, or part. Therefore, a first "device", "component", "region", "layer", or "part" discussed below is used to distinguish from a second "device", "component", "region", "layer", or "part" and is not intended to limit a sequence or a specific device, component, region, layer, and/or part.

The electronic device can achieve its effects through the redistribution layer structure of the embodiment of the disclosure. The electronic device may include a display device, an antenna device, a sensing device, a tiled device, a package device, or a transparent display device, but is not limited thereto. The electronic device may include a rollable, stretchable, bendable, or flexible electronic device. The electronic device may include electronic elements. The electronic elements may include, for example, capacitors, resistors, inductors, variable capacitors, filters, diodes, light emitting diodes, transistors, micro-electro-mechanical system components (MEMS), liquid crystal chips, integrated chips (ICs), redistribution layer structures, printed circuit board (PCB), etc., but is not limited thereto. An electronic element (for example, a resistor) may be coupled to another electronic element (for example, an IC) through the redistribution layer structures. The electronic device may include, for example, liquid crystal materials, light-emitting diodes (LED), quantum dot (QD) materials, fluorescence materials, phosphor materials, or other suitable materials, and the above materials may be arbitrarily arranged and combined. The light-emitting diodes may include, for example, organic light-emitting diode (OLED), mini LED, micro LED or quantum dot LED (e.g., QLED or QDLED), but is not limited thereto. The antenna device may include, for example, a liquid crystal antenna but is not limited thereto. The tiled device may be, for example, a tiled display device or a tiled antenna device but is not limited thereto. It is noted that the electronic device may be any combination of the above but is not limited thereto. In addition, the shape of the electronic device may be rectangular, circular, polygonal, a shape with curved edges, or other suitable shapes. The electronic device may have peripheral systems such as a driving system, a control system, a light source system, a rack system, etc. to support a display device, an antenna device, or a tiled device. Hereinafter, a redistribution layer structure will be described to illustrate the content of the disclosure, but the disclosure is not limited thereto.

In the disclosure, various embodiments described below may be mixed and combined without departing from the spirit and scope of the disclosure. For example, some features of one embodiment may be combined with some features of another embodiment to form still another embodiment.

Reference will now be made in detail to the exemplary embodiments of the disclosure, examples of which are illustrated in the accompanying drawings. Whenever possible, the same reference numerals are used to represent the same or similar parts in the accompanying drawings and description.

FIG. 1 is a schematic cross-sectional view of a redistribution layer structure according to an embodiment of the disclosure. For clarity of the drawings and convenience of description, some components are omitted in FIG. 1. With reference to FIG. 1, the redistribution layer structure RD disposed on a carrier 100 is, for example, a redistribution circuit that can be used to form a high-density integrated circuit, but is not limited thereto. The redistribution layer structure RD may include multiple conductive layers and multiple dielectric layers alternately stacked in a normal direction of the carrier 100 (for example, in the z-axis direction).

FIG. 1 illustrates a part of the redistribution layer structure RD, which includes at least a first metal layer 120, a first dielectric layer 140, a second metal layer 132, and a second dielectric layer 162. In some embodiments, the redistribution layer structure RD further includes a third metal layer 133, a third dielectric layer 163, a fourth metal layer 134, and a fourth dielectric layer 164. In the embodiment, the first dielectric layer 140 is disposed on the first metal layer 120. The second metal layer 132 is disposed on the first dielectric layer 120. The second dielectric layer 162 is disposed on the second metal layer 132. The third metal layer 133 is disposed on the second dielectric layer 162. The third dielectric layer 163 is disposed on the third metal layer 133. The fourth metal layer 134 is disposed on the third dielectric layer 163. The fourth dielectric layer 164 is disposed on the fourth metal layer 134. It should be noted that, for the clarity of the drawings, only four metal layers and four dielectric layers are schematically shown in FIG. 1, but the numbers of the metal layers or the dielectric layers shown in FIG. 1 are not intended to limit the disclosure. In other embodiments, the number of the metal layers and the dielectric layers may be more or less, depending on the actual requirements of users. In addition, the disclosure does not limit the circuit layout of the redistribution layer structure RD. In the embodiment, since the chemical resistance or the residual stress of the first dielectric layer 140 of the redistribution layer structure RD is at least different from the chemical resistance or the residual stress of the second dielectric layer 162, the redistribution layer structure RD may have higher chemical resistance. Or, the redistribution layer structure RD can reduce the stress or reduce the probability of warpage. Therefore, the redistribution layer structure RD has good structural rigidity or quality. In addition, for the manufacturing process, the redistribution layer structure RD can achieve good process yield or quality. The following will briefly describe the material and structural relationship of each layer.

Referring to FIG. 1, the redistribution layer structure RD of the embodiment can be disposed on the carrier 100 during the manufacturing process, and the carrier 100 may be removed after the manufacturing process is completed. In some embodiments, the carrier 100 may not be removed and the redistribution layer structure RD may be disposed on the carrier 100 after the manufacturing process is completed. The material of the carrier 100 may include glass, quartz, sapphire, ceramic, stainless steel, silicon wafer, molding compound (such as resin, epoxy resin, organic silicon compound), an integrated circuit chip encapsulated with a molding compound, polycarbonate (PC), polyimide (PI), polyethylene terephthalate (PET), other suitable carrier materials, or a combination of the foregoing, but not limited thereto.

In the embodiment, the first metal layer 120 of the redistribution layer structure RD is disposed on the carrier 100. The material of the first metal layer 120 includes molybdenum (Mo), tantalum (Ta), niobium (Nb), hafnium (HO, nickel (Ni), chromium (Cr), cobalt (Co), zirconium (Zr), tungsten (W), aluminum (Al), titanium (Ti), copper (copper, Cu), other suitable metals, or alloys of the above materials or combinations of the above materials, but not limited thereto. In some embodiments, the first metal layer 120 is, for example, a single metal layer or a stacked structure with multiple sub-metal layers stacked. For example, the first metal layer 120 may be a single copper layer. Alternatively, the first metal layer 120 may include a stack of at least two sub-metal layers. One of the two sub-metal layers includes titanium, and the other includes copper. Therefore, the first metal layer 120 may also be a titanium-copper multilayered stacked structure, but not limited to thereto.

The first dielectric layer 140 is disposed on the first metal layer 120. The first dielectric layer 140 may be an organic insulating layer, and its material may include photosensitive polyimide, organic polymer material, photoresist material, or other suitable materials, but not limited thereto. In some embodiments, the first dielectric layer 140 includes polyimide, polybenzoxazole, benzocyclobutene, cyclo olefin polymer, or polysiloxane, other suitable materials, or a combination of the above materials, but not limited thereto.

The second metal layer 132 is disposed on the first dielectric layer 140. The material of the second metal layer 132 may be the same as or different from the material of the first metal layer 120, for example, the materials including molybdenum, tantalum, niobium, hafnium, nickel, chromium, cobalt, zirconium, tungsten, aluminum, titanium, copper, other suitable metals, or alloys or combinations of the above materials, but not limited thereto. In some embodiments, the second metal layer 132 is, for example, a single metal layer or a stacked-layer structure with multiple sub-metal layers stacked on each other. For example, the second metal layer 132 may be a single copper layer. Alternatively, the second metal layer 132 may include a stack of at least two sub-metal layers. One of the two sub-metal layers includes titanium, and the other includes copper. Therefore, the second metal layer 132 may be a titanium-copper multilayered stacked structure, but not limited thereto.

In the embodiment, the first metal layer 120 and the second metal layer 132 are separated from each other by the first dielectric layer 140, but not limited thereto.

The second dielectric layer 162 is disposed on the second metal layer 132. The second dielectric layer 162 may be an organic insulating layer, and its material may include photosensitive polyimide materials, organic polymer materials, photoresist materials, or other suitable materials. In some embodiments, the second dielectric layer 162 may include polyimide, polybenzoxazole, benzocyclobutene, cyclo olefin polymer, or polysiloxane, other suitable materials, or a combination of the above materials, but not limited thereto.

The redistribution layer structure RD not only includes the first metal layer 120, the first dielectric layer 140, the second metal layer 132, and the second dielectric layer 162 described above, but also includes the third metal layer 133, the third dielectric layer 163, and the fourth metal layer 134, and the fourth dielectric layer 164 stacked in sequence. The disclosure is not limited to the number of metal layers and dielectric layers shown above.

The third metal layer 133 is disposed on the second dielectric layer 162, and the material of the third metal layer 133 may be the same as or different from the material of the second metal layer 132; the third dielectric layer 163 is disposed on the third metal layer 133, and the material of the third dielectric layer 163 may be the same as or different from the material of the second dielectric layer 162; the fourth metal layer 134 is disposed on the third dielectric layer 163, and the material of the fourth metal layer 134 may be the same as or different from the material of the third metal layer 133; the fourth dielectric layer 164 is disposed on the fourth metal layer 134, and the material of the fourth dielectric layer 164 may be the same as or different from the material of the third dielectric layer 163, hence the materials used will not be repeated herein. Through the second dielectric layer 162, the second metal layer 132 and the third metal layer 133 are separated from each other. Through the third dielectric layer 163, the third metal layer 133 and the fourth metal layer 134 are separated from each other, but not limited to this.

In the embodiment, the chemical resistance of the first dielectric layer 140 is greater than the chemical resistance of the second dielectric layer 162. In the disclosure, the chemical resistance is the resistance of the material of the dielectric layer to solvents during the lithographic etching process. For example, the resistance of the material of the first dielectric layer 140 to the solvent used in the manufacturing process is greater than the resistance of the material of the second dielectric layer 162 to the solvent used in the manufacturing process. The criteria for determining the chemical resistance of the dielectric layer can be measured by means of adhesive force testing, observation of film thickness changes, or observation of film surface condition. For example, the adhesive force testing can be conducted in the form of an adhesion test. The steps of the adhesion test include: 1. Form multiple knife marks with the same distance on the dielectric layer, so as to form, for example, a 10×10 grids including one-hundred rectangles (e,g. squares); 2. Pasting a tape onto the grids of one-hundred rectangles on the dielectric layer; 3. Tearing off the tape; 4. Obtaining images visually or with a camera device to determine whether the dielectric layer has fallen off. In the above detection method, the number of rectangles falling off from the surface of the first dielectric layer 140 is less than the number of rectangles falling off from the surface of the second dielectric layer 162. In other words, the adhesive force of the first dielectric layer 140 is greater than the adhesive force of the second dielectric layer 162. Therefore, it can be determined that the chemical resistance of the first dielectric layer 140 is greater than the chemical resistance of the second dielectric layer 162.

In addition, the steps for determining chemical resistance by means of observing changes in film thickness or observing film surface conditions include: 1. providing the first dielectric layer 140 and the second dielectric layer 162 with the same thickness; 2. Soaking the first dielectric layer 140 and the second dielectric layer 162 with a solvent; 3. Observing the film thickness of the first dielectric layer 140 and the second dielectric layer 162 or the surface conditions of the first dielectric layer 140 and the second dielectric layer 162 by acquiring images visually or with a camera device. Take the method of observing the change of film thickness as an example. The redistribution layer structure RD can be used to obtain the cross-sectional image of the first dielectric layer 140 and the cross-sectional image of the second dielectric layer 162 through an electron microscope to compare the difference of the maximum film thickness. If the maximum film thickness of the first dielectric layer 140 is greater than the maximum film thickness of the second dielectric layer 162, it can be determined that the chemical resistance of the first dielectric layer 140 is greater than the chemical resistance of the second dielectric layer 162. Take the method of observing the film surface as an example. Through an electron microscope, the surface image of the first dielectric layer 140 and the surface image of the second dielectric layer 162 of the redistribution layer structure RD can be obtained by the camera device. The obtained surface images of the first dielectric layer 140 and the second dielectric layer 162 are then compared for the differences of surface damages. If the surface damage of the first dielectric layer 140 is less than the surface damage of the second dielectric layer 162, for example, the surface roughness of the first dielectric layer 140 is less than the surface roughness of the second dielectric layer 162, then it is determined that the chemical resistance of the first dielectric layer 140 is greater than the chemical resistance of the second dielectric layer 162.

In addition, compared to the second dielectric layer 162, the first dielectric layer 140 with greater chemical resistance also has a higher residual stress. In other words, the residual stress of the second dielectric layer 162 will be less than the residual stress of the first dielectric layer 140. In the disclosure, the residual stress is the stress of the dielectric layer when the force reached balance in the dielectric layer under the condition that no external force is applied. The residual stress of the dielectric layer may be affected by the Young's modulus, Poisson's ratio, coefficient of thermal expansion (CTE) or temperature of the manufacturing process, or other process conditions of the dielectric layer material. In the disclosure, the dielectric layer with high residual stress is prone to high deformation, and therefore the dielectric layer with high residual stress is likely to cause warpage or adversely affect the redistribution layer structure during the manufacturing process.

In the embodiment, it is worth noting that the chemical resistance of the first dielectric layer 140 of the redistribution layer structure RD is greater than the chemical resistance of the second dielectric layer 162, or the residual stress of the second dielectric layer 162 is less than the residual stress of the first dielectric layer 140. In the manufacturing process, the first dielectric layer 140 undergoes multiple subsequent lithographic etching processes, heating baking processes, or multiple solvent cleaning processes. Therefore, the first dielectric layer 140 with greater chemical resistance can reduce the impact of the manufacturing processes on the first dielectric layer 140, or maintains the structural rigidity of the first dielectric layer 140. In addition, the redistribution layer structure RD can reduce the deformation of the dielectric layer or reduce the probability of warpage by providing the second dielectric layer 162 with a smaller residual stress. In this way, the redistribution layer structure RD can have good structural rigidity or quality. In addition, in the manufacturing process, the redistribution layer structure RD can achieve good process yield or quality.

In some embodiments, the materials of the third dielectric layer 163 and the second dielectric layer 162 may be similar. In other words, the chemical resistance of the first dielectric layer 140 is greater than the chemical resistance of the third dielectric layer 163. Or, the residual stress of the first dielectric layer 140 is greater than the residual stress of the third dielectric layer 163 (or conversely, the residual stress of the third dielectric layer 163 is less than the residual stress of the first dielectric layer 140). In this way, the first dielectric layer 140 with greater chemical resistance can reduce the influence of multiple solvent cleaning processes during the processing of the first dielectric layer 140 or maintain the structural rigidity of the first dielectric layer 140. Through providing the third dielectric layer 163 with a smaller residual stress, the deformation or the probability of warpage of the dielectric layer of the redistribution layer structure RD is reduced. In this way, the redistribution layer structure RD can have good structural rigidity or quality. In addition, in the manufacturing process, the redistribution layer structure RD can achieve good process yield or quality.

In other embodiments, the chemical resistance of the first dielectric layer 140 may be greater than the chemical resistance of the fourth dielectric layer 164. Alternatively, the residual stress of the first dielectric layer 140 is greater than the residual stress of the fourth dielectric layer 164, but not limited thereto. The redistribution layer structure RD can achieve the above-mentioned good technical effects.

In other embodiments, the chemical resistance of the first dielectric layer 140 is greater than the chemical resistance of the second dielectric layer 162 (or the residual stress of the first dielectric layer 140 is greater than the residual stress of the second dielectric layer 162). The chemical resistance or residual stress of the second dielectric layer 162 and the third dielectric layer 163 may be the same or different. The chemical resistance of the second dielectric layer 162 is greater than the chemical resistance of the fourth dielectric layer 164, which is the uppermost layer (or the last formed layer). Or, the residual stress of the second dielectric layer 162 is greater than the residual stress of the fourth dielectric layer 164. In other embodiments, the chemical resistance of the multiple dielectric layers in the redistribution layer structure RD can be gradually decreased in a gradient according to the order of formation in the manufacturing process. Or, the residual stress of the multiple dielectric layers can be gradually decreased in a gradient according to the order of the formation in the manufacturing process, but not limited thereto.

Other embodiments will be described hereinafter as the description of the manufacturing process. It should be noted here that the following embodiments continue to use the reference numerals and a portion of the content of the foregoing embodiments. The same reference numerals are used to represent the same or similar elements, and the description of the same technical content is omitted. Reference may be made to the foregoing embodiments for the description of the omitted parts, which are not repeated in the following embodiments.

Figure 2:
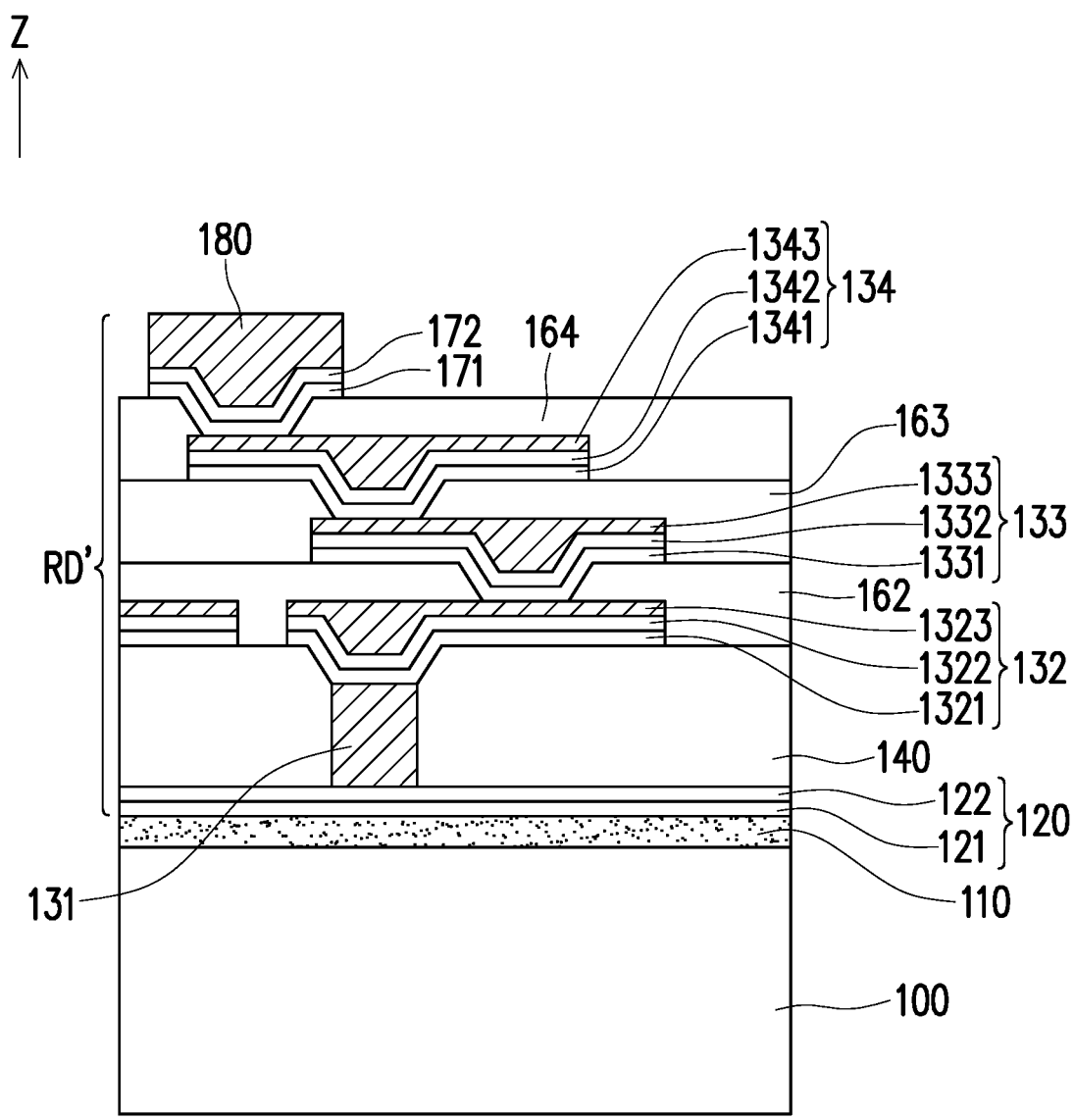
FIG. 2 is a schematic cross-sectional view of a redistribution layer structure according to another embodiment of the disclosure.

FIG. 2 is a schematic cross-sectional view of a redistribution layer structure according to another embodiment of the disclosure. For clarity of the drawings and convenience of description, several components are omitted in FIG. 2. In the embodiment, the redistribution layer structure RD' is roughly similar to the redistribution layer structure RD shown in FIG. 1, so the same and similar components in the two embodiments will not be repeated herein. The following will briefly describe the steps of the manufacturing process of the redistribution layer structure RD'.

First, a carrier 100 is provided. In the embodiment, the material of the carrier 100 is, for example, glass, but not limited thereto.

Next, before disposing the first metal layer 120, a debonding layer 110 may be selectively disposed. Then, the first metal layer 120 is disposed on the debonding layer 110. The material of the debonding layer 110 includes polyethylene (PE), polyethylene terephthalate (PET), oriented polypropylene (OPP) film, or other suitable materials, or combinations of the above materials, but not limited thereto. The debonding layer 110 can be decomposed by a dissociation system, such as a photodissociation system or a thermal dissociation system. For example, in the case of a photodissociation system, the debonding layer 110 can be irradiated with a laser beam or an ultraviolet beam, so that the debonding layer 110 absorbs the energy of the beam to generate a dissociation reaction. In this way, the debonding layer 110 can be separated from the first metal layer 120. In terms of the thermal dissociation system, the debonding layer 110 can be heated by a heat source, so that the debonding layer 110 absorbs the energy of the heat source to produce a dissociation reaction. In this way, the debonding layer 110 can be separated from the first metal layer 120. Other dissociation systems can also be used, and the disclosure is not limited thereto.

In the embodiment, the first metal layer 120 is a single metal layer or a stacked structure with multiple sub-metal layers stacked on each other. Referring to FIG. 2, the first metal layer 120 may include a stack of a first sub-metal layer 121 and a second sub-metal layer 122. The method of forming the first metal layer 120 includes the following steps. First, in an environment of about 120 degrees Celsius (120° C.), a sputtering process is performed for about 30 seconds to 120 seconds to form a first sub-metal layer 121 containing titanium on the debonding layer 110. A thickness of the first sub-metal layer 121 is about 1000 Angstroms (Å). Then, in an environment of about 120° C., a sputtering process is performed for about 30 seconds to 120 seconds to form a second sub-metal layer 122 containing copper on the first sub-metal layer 121. A thickness of the second sub-metal layer 122 is about 2000 angstroms. Under the above configuration, the thickness of the second sub-metal layer 122 containing copper is greater than the thickness of the first sub-metal layer 121 containing titanium. Therefore, the manufacturing process stability and the uniformity of the film thickness may be increased.

Next, a first dielectric layer 140 is disposed on the second sub-metal layer 122. The material of the first dielectric layer 140 is, for example, photosensitive polyimide materials, an organic polymer material, a photoresist material, or other suitable materials of high chemical resistance or high residual stress, but not limited thereto. The method for forming the first dielectric layer 140 includes chemical vapor deposition (CVD), physical vapor deposition (PVD), atomic layer deposition (ALD), spin coating or screen printing, or other suitable methods, but not limited thereto. For example, a photosensitive polyimide-based material with high chemical resistance or high residual stress can be disposed on the second sub-metal layer 122 by a coating process at about 120° C. for about 180 seconds to 300 seconds. Then, the above-mentioned material is heated to about 230° C. so as to perform a baking process for about 3600 seconds to form a first dielectric layer 140 with a thickness of about 5 micrometer (µm) to 20 µm.

Next, before disposing the second metal layer 132 on the first dielectric layer 140, the first dielectric layer 140 may be patterned by a lithographic etching process. For example, an opening (not shown) may be formed in the first dielectric layer 140. Then, a conductive structure 131 may be formed in the opening of the first dielectric layer 140. The material of the conductive structure 131 includes, for example, molybdenum, tantalum, niobium, hafnium, nickel, chromium, cobalt, zirconium, tungsten, aluminum, titanium, copper, other suitable metals, or alloys or combinations of the above materials, but not limited thereto. The forming method of the conductive structure 131 includes the following steps. First, an electroplating process is performed for about 300 seconds to 1800 seconds at room temperature or an environment of about 26° C. so as to form the conductive structure 131 containing copper in the opening. And, a thickness of the conductive structure 131 is about 3 µm to 10 µm. The conductive structure 131 may be coupled to the second sub-metal layer 122.

In other embodiments, the conductive structure 131 may be formed on the second sub-metal layer 122 first, and then the first dielectric layer 140 may be disposed on the conductive structure 131 and the second sub-metal layer 122. Then, a top surface of the conductive structure 131 is exposed through a patterning process, but the manufacturing method of the present disclosure is not limited thereto.

In other embodiments, the conductive structure 131 may also be regarded as a part of the first metal layer 120. In other words, the first metal layer 120 may be a stacked structure of titanium-copper-copper, but not limited thereto.

Next, the second metal layer 132 is disposed on the first dielectric layer 140. The second metal layer 132 may be a single metal layer or a stacked structure having multiple sub-metal layers stacked on each other. For example, the second metal layer 132 may include a stack of a first sub-metal layer 1321 and a second sub-metal layer 1322. The method of forming the second metal layer 132 includes the following steps. First, performing a sputtering process at about 120° C. for about 30 seconds to 120 seconds to form the first sub-metal layer 1321 containing titanium on the first dielectric layer 140 and in the opening of the first dielectric layer 140. A thickness of the first sub-metal layer 1321 is about 1000 angstroms. Then, in an environment of about 120° C., a sputtering process is performed for about 30 seconds to 120 seconds to form the second sub-metal layer 1322 containing copper on the first sub-metal layer 1321. A thickness of the second sub-metal layer 1322 is about 2000 angstroms. Under the above configuration, the thickness of the second sub-metal layer 1322 including copper is greater than the thickness of the first sub-metal layer 1321 including titanium, which will improve the process stability and the uniformity of the film thickness. In some embodiments, the second metal layer 132 may be a stack of two sub-metal layers including titanium and copper, but the disclosure is not limited thereto.

In other embodiments, the second metal layer 132 further includes a third sub-metal layer 1323. The method of forming the second metal layer 132 further includes: after forming the second sub-metal layer 1322, performing an electroplating process for about 300 seconds to 1800 seconds at room temperature or an environment of about 26° C. to form the third sub-metal layer 1323 containing copper on the second sub-metal layer 1322. A thickness of the third sub-metal layer 1323 is about 3 μm to 10 μm. In other words, the second metal layer 132 may be a stack of three sub-metal layers including titanium-copper-copper, but is not limited thereto. In the embodiment, portions of the first sub-metal layer 1321, the second sub-metal layer 1322, or the third sub-metal layer 1323 may be filled in the opening of the first dielectric layer 140. The first sub-metal layer 1321 may be coupled to the conductive structure 131. In this way, the second metal layer 132 can be coupled to the first metal layer 120 through the conductive structure 131.

Next, a second dielectric layer 162 is disposed on the second metal layer 132. Compared with the first dielectric layer 140, the material of the second dielectric layer 162 is, for example, a photosensitive polyimide material, an organic polymer material, a photoresist material or other suitable materials of lower chemical resistance or lower residual stress, but not limited thereto. The method of forming the second dielectric layer 162 includes chemical vapor deposition, physical vapor deposition, atomic layer deposition, spin coating or plate printing, or other suitable methods, but not limited thereto. For example, a photosensitive polyimide-based material can be disposed on the second metal layer 132 in a coating process for about 180 seconds to 300 seconds at environment of about 120° C. Then, the above-mentioned material is heated to about 230° C., and undergoes a baking process for about 3600 seconds to form a second dielectric layer 162 with a thickness of about 5 μm to 20 μm.

Under the above settings, since the chemical resistance of the first dielectric layer 140 is greater than the chemical resistance of the second dielectric layer 162. Or, the residual stress of the second dielectric layer 162 is less than the residual stress of the first dielectric layer 140. The first dielectric layer 140 that underwent many process-steps may be less affected by the manufacturing process or maintained its structural rigidity, due to its greater chemical resistance. The second dielectric layer 162 with less residual stress can reduce the influence of deformation or reduce the probability of warpage during the manufacturing process. In this way, the redistribution layer structure RD' can achieve good process yield or quality. In addition, the formed redistribution layer structure RD' may have good structural rigidity or quality.

In some embodiments, the thickness of the first dielectric layer 140 may be greater than the thickness of the second dielectric layer 162. In other embodiments, the thickness of the first dielectric layer 140 may be equal to the thickness of the second dielectric layer 162. In this way, the redistribution layer structure RD' can have good chemical resistance or good structural rigidity. In addition, redistribution layer structure RD' can reduce stress or reduce the probability of warpage.

Then, before disposing a third metal layer 133 on the second dielectric layer 162, the second dielectric layer 162 may be patterned through a photolithography process. For example, an opening (not shown) may be formed in the second dielectric layer 162 to expose a portion of the second metal layer 132. In some embodiments, the opening of the second dielectric layer 162 may not overlap the opening of the first dielectric layer 140, but not limited thereto. In other embodiments, the opening of the second dielectric layer 162 may also at least partially overlap the opening of the first dielectric layer 140.

Next, the third metal layer 133 is provided on the second dielectric layer 162. The third metal layer 133 may be a single metal layer or a stacked structure having multiple sub-metal layers stacked on each other. For example, the third metal layer 133 may include a stack of a first sub-metal layer 1331 and a second sub-metal layer 1332. The method of forming the third metal layer 133 includes the following steps. First, under an environment of about 120° C., a sputtering process is performed for about 30 seconds to 120 seconds to form the first sub-metal layer 1331 containing titanium on the second dielectric layer 162 and in the opening of the second dielectric layer 162. A thickness of the first sub-metal layer 1331 is about 1000 angstroms. Then, under an environment of about 120° C., a sputtering process is performed for about 30 seconds to 120 seconds to form the second sub-metal layer 1332 containing copper on the first sub-metal layer 1331. A thickness of the second sub-metal layer 1332 is about 2000 angstroms. Under the above configuration, the thickness of the second sub-metal layer 1332 containing copper is greater than the thickness of the first sub-metal layer 1331 containing titanium. The manufacturing process stability or the uniformity of the film thickness may be increased. In some embodiments, the third metal layer 133 may be a stack of two sub-metal layers including titanium and copper, but the disclosure is not limited thereto.

In other embodiments, the third metal layer 133 also includes a third sub-metal layer 1333. The method of forming the third metal layer 133 further includes: after forming the second sub-metal layer 1332, performing an electroplating process for about 300 seconds to 1800 seconds at room temperature or an environment of about 26° C. to form the third sub-metal layer 1333 containing copper on the second sub-metal layer 1332. A thickness of the third sub-metal layer 1333 is about 3 μm to 10 μm. In other words, the third metal layer 133 may be a stack of three sub-metal layers including titanium-copper-copper, but is not limited to this. In the embodiment, portions of the first sub-metal layer 1331, the second sub-metal layer 1332 or the third sub-metal layer 1333 can be filled in the opening of the second dielectric layer 162. The first sub-metal layer 1331 of the third metal layer 133 may be coupled to the third sub-metal layer 1323 of the second metal layer 132. In this way, the third metal layer 133 can be coupled to the second metal layer 132.

Next, a third dielectric layer 163 is provided on the third metal layer 133. The material of and method of disposing the third dielectric layer 163 are similar to those of the second dielectric layer 162, so it will not be repeated herein.

In some embodiments, the thickness of the third dielectric layer 163 may be similar to the thickness of the second dielectric layer 162, but not limited thereto. In other embodiments, the thickness of the first dielectric layer 140 may be greater than or equal to a thickness of the third dielectric layer 163.

Then, before disposing the fourth metal layer 134 on the third dielectric layer 163, the third dielectric layer 163 may be patterned through a photolithography process. For example, an opening (not labeled) may be formed in the third dielectric layer 163 to expose a portion of the third metal layer 133. In some embodiments, the opening of the third dielectric layer 163 may or may not overlap the opening of the second dielectric layer 162, but not limited thereto. In other embodiments, the opening of the third dielectric layer 163 may at least partially overlap the opening of the first dielectric layer 140, but not limited thereto.

Next, a fourth metal layer 134 is disposed on the third dielectric layer 163. The fourth metal layer 134 may be a single metal layer or a stacked structure with multiple sub-metal layers stacked on each other. For example, the fourth metal layer 134 may include a stack of a first sub-metal layer 1341 and a second sub-metal layer 1342. The method of forming the fourth metal layer 134 includes the following steps. First, under an environment of about 120° C., a sputtering process is performed for about 30 seconds to 120 seconds to form a first sub-metal layer 1341 containing titanium on the third dielectric layer 163 and in the opening of the third dielectric layer 163. A thickness of the first sub-metal layer 1341 is about 1000 angstroms. Next, a sputtering process is performed for about 30 seconds to 120 seconds under an environment of about 120° C., to form a second sub-metal layer 1342 containing copper on the first sub-metal layer 1341. A thickness of the second sub-metal layer 1342 is about 2000 angstroms to 3000 angstroms. Under the above configuration, the thickness of the second sub-metal layer 1342 containing copper is greater than the thickness of the first sub-metal layer 1341 containing titanium. The manufacturing process stability and the uniformity of the film thickness may be improved. In some embodiments, the fourth metal layer 134 may be a stack including two sub-metal layers of titanium and copper, but the disclosure is not limited thereto.

In other embodiments, the fourth metal layer 134 further includes a third sub-metal layer 1343. The method of forming the fourth metal layer 134 further includes: after forming the second sub-metal layer 1342, performing an electroplating process for about 300 seconds to 1800 seconds at room temperature or an environment of about 26° C. to form the third sub-metal layer 1343 containing copper on the second sub-metal layer 1342. A thickness of the third sub-metal layer 1343 is about 3 μm to 10 μm. That is, the fourth metal layer 134 may be a stack of three sub-metal layers including titanium-copper-copper, but not limited thereto. In the embodiment, portions of the first sub-metal layer 1341, the second sub-metal layer 1342 or the third sub-metal layer 1343 may be filled in the opening of the third dielectric layer 163. The first sub-metal layer 1341 of the fourth metal layer 134 may be coupled to the third sub-metal layer 1333 of the third metal layer 133. In this way, the fourth metal layer 134 can be coupled to the third metal layer 133.

Next, a fourth dielectric layer 164 is provided on the fourth metal layer 134. The material of and the method of disposing the fourth dielectric layer 164 are similar to those of the third dielectric layer 163 (or the second dielectric layer 162), so it will not be repeated herein.

In some embodiments, a thickness of the fourth dielectric layer 164 may be similar to the thickness of the third dielectric layer 163 (or the second dielectric layer 162), but not limited thereto. In other embodiments, the thickness of the first dielectric layer 140 may be greater than or equal to the thickness of the fourth dielectric layer 164.

Next, before forming a first conductive bump 180 of the redistribution layer structure RD', the fourth dielectric layer 164 may be patterned through a photolithography process. For example, an opening (not labeled) may be formed in the fourth dielectric layer 164 to expose a portion of the fourth metal layer 134. In some embodiments, the opening of the fourth dielectric layer 164 may at least partially overlap, or not overlap, with the opening of the third dielectric layer 163. In other embodiments, the opening of the fourth dielectric layer 164 may not overlap or at least partially overlap the opening of the first dielectric layer 140.

The first conductive bump 180 is, for example, the uppermost pad of the redistribution layer structure RD', but not limited thereto. Before forming the first conductive bump 180, a first sub-metal layer 171 or a second sub-metal layer 172 may be selectively disposed on the fourth dielectric layer 164. For example, the stack of the first sub-metal layer 171 and the second sub-metal layer 172 can be disposed on the fourth dielectric layer 164 and in the opening of the fourth dielectric layer 164. The forming method of the first sub-metal layer 171 and the second sub-metal layer 172 includes the following steps. First, under an environment of about 120° C., a sputtering process is performed for about 30 seconds to 120 seconds to form the first sub-metal layer 171 containing titanium on the fourth dielectric layer 164 and in the opening of the fourth dielectric layer 164. A thickness of the first sub-metal layer 171 is about 1000 angstroms. Then, under an environment of about 120° C., a sputtering process is performed for about 30 seconds to 120 seconds to form the second sub metal layer 172 containing copper on the first sub metal layer 171. A thickness of the second sub-metal layer 172 is about 2000 angstroms to 3000 angstroms. Under the above configuration, the thickness of the second sub-metal layer 172 containing copper is greater than the thickness of the first sub-metal layer 171 containing titanium. The manufacturing process stability and the uniformity of the film thickness may be improved.

Next, the first conductive bumps 180 are formed on the fourth dielectric layer 164. The first conductive bump 180 may be a single metal layer or a stacked structure with multiple sub-metal layers stacked on each other. The method of forming the first conductive bump 180 includes: after forming the second sub-metal layer 172, performing an electroplating process for about 300 seconds to 1800 seconds at room temperature or an environment of about 26° C. to form the first conductive bump 180 containing copper on the second sub-metal layer 172. A thickness of the first conductive bump 180 is about 3 μm to 10 μm. In this way, the first sub-metal layer 171, the second sub-metal layer 172, and the first conductive bump 180 may be a stack of three layers including titanium-copper-copper, but not limited thereto. The first sub-metal layer 171 may be coupled to the third sub-metal layer 1343 of the fourth metal layer 134. In this way, the first conductive bump 180 can be coupled to the fourth metal layer 134. In this way, the first conductive bump 180 can be coupled to the first metal layer 120 through the fourth metal layer 134, the third metal layer 133, and the second metal layer 132.

After the first conductive bumps 180 are formed on the fourth dielectric layer 164, an electronic element (for example, an IC) may be coupled to the first conductive bumps 180.

In other embodiments, the material of the carrier 100 is, for example, silicon wafer, but not limited thereto. Next, forming the electronic elements (for example, ICs) in the carrier 100. In some embodiments, after the redistribution layer structure RD' is formed on the carrier 100 and coupled to the electronic elements (for example, ICs), another electronic element (for example, a resistance) may be coupled to the first conductive bumps 180. In the embodiment, the carrier 100 may not be removed from the redistribution layer structure RD'.

In other embodiments, forming a plurality of electronic elements (for example, ICs) in a silicon wafer. Next, dicing the silicon wafer to make the plurality of electronic elements. Next, disposing at least one of the plurality of electronic elements on a surface of the carrier. Next, molding the electronic element by an insulating layer. The insulating layer may include resin or epoxy, but is not limited thereto.

In some embodiments, the electronic element has some bonding pads facing the surface of the carrier (Face-Down). Next, after the carrier is removed, the redistribution layer structure is formed on the bonding pads of the electronic element and coupled to the bonding pads.

In some embodiments, the electronic element has some bonding pads opposite to the surface of the carrier (Face-Up). Next, the redistribution layer structure may be formed on the bonding pads of the electronic element and coupled to the bonding pads. And, the carrier may be removed after the manufacturing process is completed.

Figure 3:
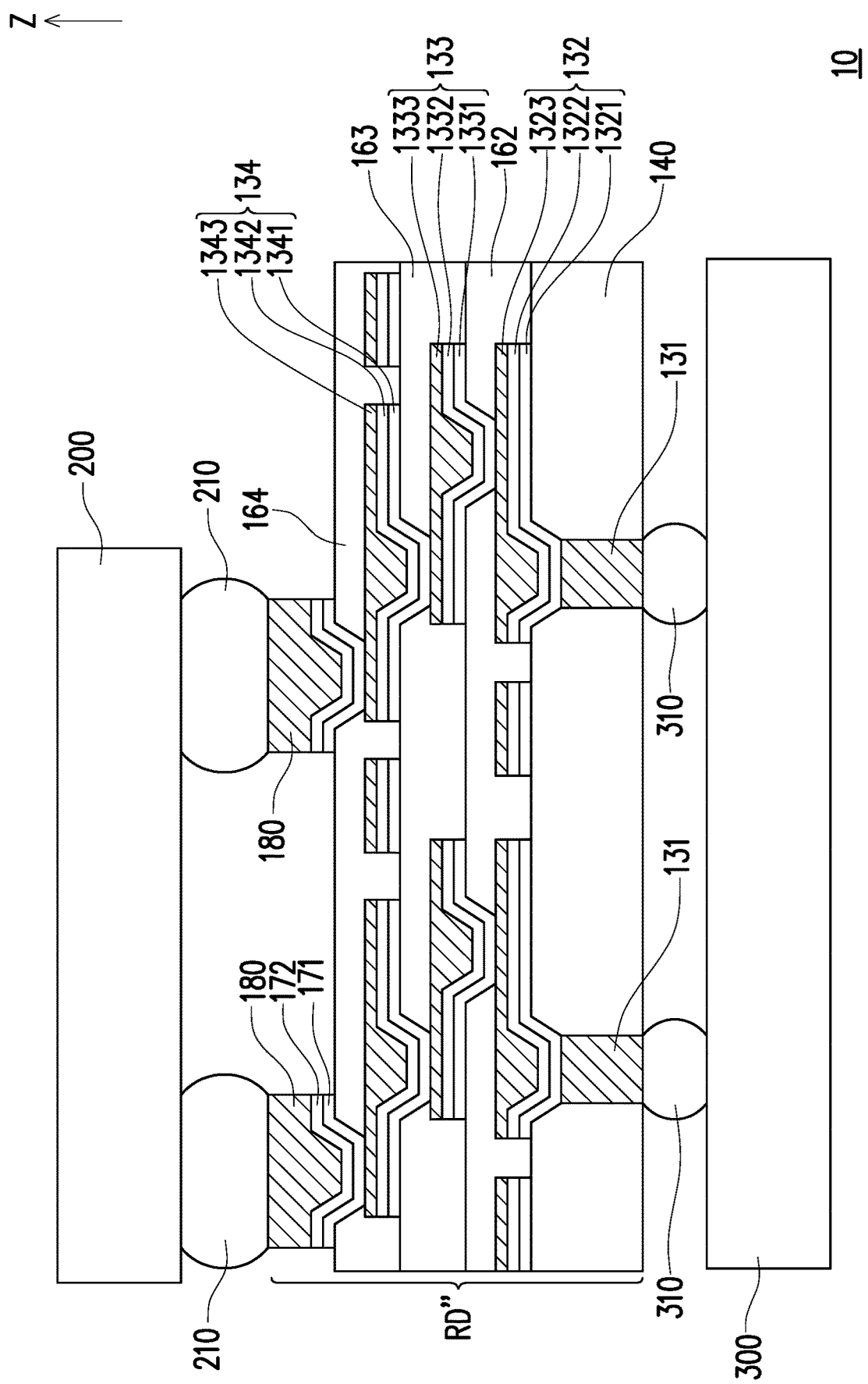
FIG. 3 is a schematic cross-sectional view of an electronic device according to an embodiment of the disclosure.

FIG. 3 is a schematic cross-sectional view of an electronic device according to an embodiment of the disclosure. For clarity of the drawings and convenience of description, some components are omitted in FIG. 3. Please refer to FIG. 2 and FIG. 3 at the same time. A redistribution layer structure RD" of an electronic device 10 of the embodiment is similar to the redistribution layer structure RD' in FIG. 2, but the difference between the two is: in the electronic device 10 of the embodiment, the redistribution layer structure RD" may include a conductive structure 131, a second metal layer 132, a third metal layer 133, a fourth metal layer 134, a first sub-metal layer 171, a second sub-metal layer 172 and a plurality of first conductive bumps 180, but is not limited thereto.

Specifically, referring to FIG. 3, the electronic device 10 of the embodiment may include the redistribution layer structure RD", a first electronic element 200, a plurality of second conductive bumps 210, a second electronic element 300 and a plurality of third conductive bumps 310. The second conductive bumps 210 may be disposed on the first electronic element 200, and the first electronic element 200 may be coupled to the redistribution layer structure RD" through the second conductive bumps 210. The third conductive bumps 310 may be disposed on the second electronic element 300, and the second electronic element 300 may be coupled to the redistribution layer structure RD" through the third conductive bumps 310, but is not limited thereto.

The manufacturing method of the electronic device 10 of the embodiment is a type of redistribution layer first process (RDL first), which may include but not limited to the following steps: first, a structure similar to FIG. 2 is formed (including the carrier 100, the debonding layer 110, and the redistribution layer structure RD', etc.). Then, the carrier 100, the debonding layer 110 and/or the first metal layer 120 in the structure are removed. For example, the carrier 100, the debonding layer 110 and/or the first metal layer 120 may be removed by laser beam, heating or other suitable methods, but not limited thereto. Next, the second conductive bumps 210 may be formed on the first electronic element 200, and the first electronic element 200 may be coupled to the redistribution layer structure RD" through the second conductive bumps 210. The third conductive bumps 310 may be formed on the second electronic element 300, and the second electronic element 300 may be coupled to the redistribution layer structure RD" through the third conductive bumps 310. And, the electronic device 10 of the embodiment has been substantially completed.

In the manufacturing method of the electronic device 10 of the embodiment, although the carrier 100 is first removed and then the first electronic element 200 is arranged, the present disclosure does not limit the sequence of the above two steps. In other words, in some embodiments, before the step of removing the carrier 100, the debonding layer 110 and/or the first metal layer 120, the first electronic element 200 may be coupled to the redistribution layer structure RD" through the second conductive bumps 210.

In addition, although the manufacturing method of the redistribution layer structure RD, RD', RD" of an embodiment of the present disclosure may be applied to the type of redistribution layer first process (RDL first), the present disclosure is not limited thereto. In some embodiments, the manufacturing method of the redistribution layer structure RD, RD', RD" of an embodiment of the present disclosure may also be applied to a type of chip first/face up process (chip first/face up) or a type of chip first/face down process (chip first/face down). In some embodiments, when the redistribution layer structure RD, RD', RD" of an embodiment of the present disclosure is applied to the type of chip first/face up process and/or the type of chip first/face down process, the carrier 100 may be a silicon wafer, but not limited thereto. In some embodiments, when the redistribution layer structure RD, RD', RD" of an embodiment of the present disclosure is applied to the type of chip first/face up process and/or the type of chip first/face down process, the debonding layer 110 may be selectively provided on the carrier 100 or need not be provided, and the redistribution layer structure RD, RD', RD" may be coupled to other electronic elements such as printed circuit boards in subsequent processes, but not limited thereto.

In addition, in some embodiments, the manufacturing method of the redistribution layer structure RD, RD', RD" of the present disclosure may be applied to, for example, a type of manufacturing semiconductor packaged electronic device, such as system on chip (SoC), system in package (SiP) or other electronic devices manufactured by the method mentioned above.

In summary, in the redistribution layer structure according to an embodiment of the disclosure, the chemical resistance of the first dielectric layer is greater than the chemical resistance of the second dielectric layer. Or, the residual stress of the second dielectric layer is less than the residual stress of the first dielectric layer. When the first dielectric layer underwent multiple manufacturing process-steps, the influence of the process on the first dielectric layer may be reduced due to the larger chemical resistance. Therefore, the impact of the process on the dielectric layer and the redistribution layer structure can be reduced, or the structural rigidity may be maintained. The second dielectric layer with less residual stress can reduce the influence of its deformation or the probability of warpage during the manufacturing process. In this way, in the manufacturing process, the redistribution layer structure can achieve good process yield or quality. In addition, the formed redistribution layer structure can have good structural rigidity or quality.

Finally, it should be noted that the foregoing embodiments are only used to illustrate the technical solutions of the disclosure, and not intended to limit the disclosure. Although the disclosure has been described in detail with reference to the foregoing embodiments, persons skilled in the art should understand that modifications to the technical solutions described in the foregoing embodiments or equivalent replacements may be made to some or all of the technical features. However, the modifications or replacements do not cause the essence of the corresponding technical solutions to depart from the scope of the technical solutions according to the embodiments of the disclosure.

What is claimed is:

1. A redistribution layer structure, comprising:
a first metal layer;
a first dielectric layer disposed on the first metal layer;
a second metal layer disposed on the first dielectric layer;
a second dielectric layer disposed on the second metal layer;
a third metal layer disposed on the second dielectric layer;
a third dielectric layer disposed on the third metal layer;
a fourth metal layer disposed on the third dielectric layer; and
a fourth dielectric layer disposed on the fourth metal layer,
wherein a chemical resistance of the first dielectric layer is greater than a chemical resistance of the second dielectric layer,
wherein the chemical resistance of the first dielectric layer is greater than a chemical resistance of the third dielectric layer,
wherein the chemical resistance of the second dielectric layer is greater than the chemical resistance of the fourth dielectric layer.

2. The redistribution layer structure according to claim 1, wherein a thickness of the first dielectric layer is greater than a thickness of the second dielectric layer.

3. The redistribution layer structure according to claim 1, wherein at least one of the first metal layer or the second metal layer comprises copper.

4. The redistribution layer structure according to claim 1, wherein at least one of the first metal layer or the second metal layer comprises a plurality of sub-metal layers.

5. The redistribution layer structure according to claim 4, wherein at least one of the plurality of sub-metal layers comprises titanium.

6. The redistribution layer structure according to claim 5, wherein at least one of the plurality of sub-metal layers comprises copper, and a thickness of the at least one sub-metal layer comprising copper is greater than a thickness of the at least one sub-metal layers comprising titanium.

7. A manufacturing method of a redistribution layer structure, the method comprising:
providing a first metal layer;
disposing a first dielectric layer on the first metal layer;
disposing a second metal layer on the first dielectric layer;
disposing a second dielectric layer on the second metal layer;
disposing a third metal layer on the second dielectric layer;
disposing a third dielectric layer on the third metal layer;
disposing a fourth metal layer on the third dielectric layer; and
disposing a fourth dielectric layer on the fourth metal layer,
wherein a chemical resistance of the first dielectric layer is greater than a chemical resistance of the second dielectric layer,
wherein the chemical resistance of the first dielectric layer is greater than a chemical resistance of the third dielectric layer,
wherein the chemical resistance of the second dielectric layer is greater than the chemical resistance of the fourth dielectric layer.

8. The method of claim 7, wherein a thickness of the first dielectric layer is greater than a thickness of the second dielectric layer.

9. The method of claim 7, wherein the chemical resistance of the first dielectric layer is greater than the chemical resistance of the fourth dielectric layer.

10. The method of claim 7, wherein a thickness of the first dielectric layer is greater than a thickness of the third dielectric layer.

11. The method of claim 7, wherein a thickness of the first dielectric layer is greater than a thickness of the fourth dielectric layer.

12. The method of claim 7, wherein a residual stress of the first dielectric layer is different from a residual stress of the second dielectric layer.

13. The method of claim 7, further comprising:
providing a carrier;
disposing a debonding layer on the carrier; and
disposing the first metal layer on the debonding layer.

14. A redistribution layer structure, comprising:
a first metal layer;
a first dielectric layer disposed on the first metal layer;
a second metal layer disposed on the first dielectric layer;
a second dielectric layer disposed on the second metal layer;
a third metal layer disposed on the second dielectric layer;
a third dielectric layer disposed on the third metal layer;
a fourth metal layer disposed on the third dielectric layer; and
a fourth dielectric layer disposed on the fourth metal layer,
wherein a residual stress of the second dielectric layer is less than a residual stress of the first dielectric layer,
wherein the chemical resistance of the first dielectric layer is greater than a chemical resistance of the third dielectric layer,
wherein the chemical resistance of the second dielectric layer is greater than the chemical resistance of the fourth dielectric layer.

15. The redistribution layer structure according to claim 14, wherein a residual stress of the third dielectric layer is less than the residual stress of the second dielectric layer.

16. The redistribution layer structure according to claim 14, wherein at least one of the first metal layer or the second metal layer comprises a first sub-metal layer, a second sub-metal layer, and a third sub-metal layer, the second sub-metal layer is disposed between the first sub-metal layer and the third-sub metal layer, the first sub-metal layer comprises titanium, the second sub-metal layer comprises copper, the third sub-metal layer comprises copper, a thickness of the third sub-metal layer is greater than a thickness of the second sub-metal layer, and the thickness of the second sub-metal layer is greater than a thickness of the first sub-metal layer.

* * * * *